United States Patent [19]
Ohkawa et al.

[11] Patent Number: 5,322,995
[45] Date of Patent: Jun. 21, 1994

[54] CHARGE INTEGRATION PREAMPLIFIER FOR USE IN RADIATION DETECTION CIRCUITRY

[75] Inventors: Shoichi Ohkawa; Kazuo Hushimi, both of Tokyo, Japan

[73] Assignee: JEOL Ltd., Tokyo, Japan

[21] Appl. No.: 34,078

[22] Filed: Mar. 22, 1993

[30] Foreign Application Priority Data

Mar. 24, 1992 [JP] Japan .................................. 4-66136

[51] Int. Cl.⁵ .............................................. H01J 40/14
[52] U.S. Cl. .................................. 250/214 A; 328/127; 330/308
[58] Field of Search ........ 250/214 A, 214 C, 214 RC, 250/214 AG; 328/127; 307/228; 330/308, 59

[56] References Cited

U.S. PATENT DOCUMENTS 4,750,217  6/1988  Smith et al. ............... 250/214 A
4,808,810  2/1989  Van Doorn ................. 250/214 A

OTHER PUBLICATIONS

"Charge Amplification Without Charge Leak Resistor", V. Radeka, IEEE Trans., Nucl. Sci., NS-17, No. 3, pp. 433-439 (1970).

"An Improved Operating Mode For a Si(Li) X-Ray Spectrometer", N. W. Madden, F. S. Goulding et al., IEEE Trans. Nucl. Sci., NS-37, No. 2, pp. 171-176, (1990).

Primary Examiner—David C. Nelms
Assistant Examiner—Que T. Le
Attorney, Agent, or Firm—Webb Ziesenheim Bruening Logsdon Orkin & Hanson

[57] ABSTRACT

A charge integration-type preamplifier for use with a radiation detector. The preamplifier is capable of electronically resetting a feedback capacitor, prevents intrusion of noise, and offers high resolution and high counting rate. An inverting amplifier is connected with the radiation detector and has an N-channel FET at its first stage. The output signal from this amplifier is fed back to the gate of the FET via an electrostatic capacitor. The preamplifier further includes a reset means which urges the voltage at the output of the inverting amplifier to rise via the capacitor by utilizing the feedback action. The junction between the gate and the source of the FET is forward-biased to release the charge stored in the capacitor to the source, thus resetting the capacitor. This maintains continuous operation. Thus, any interference causing noise between the radiation detector and the gate of the FET is not created. Furthermore, the disturbance caused by the resetting can be removed in a short time.

6 Claims, 3 Drawing Sheets

CHARGE INTEGRATION PREAMPLIFIER FOR USE IN RADIATION DETECTION CIRCUITRY

FIELD OF THE INVENTION

The present invention relates to a charge integration-type radiation detection preamplifier which feeds the output signal from an inverting amplifier having an N-channel FET at its first stage back to the gate of the FET via an electrostatic capacitor.

BACKGROUND OF THE INVENTION

A conventional preamplifier for radiation detection is shown in FIG. 5. The waveform of the output voltage from the preamplifier is shown in FIG. 6. Another conventional radiation detection preamplifier which superimposes a reset pulse on the DC bias voltage applied to a radiation detector is shown in FIG. 7. A further conventional radiation detection preamplifier which applies a reset pulse to the base of a PNP transistor is shown in FIG. 8.

In a radiation detector using a semiconductor such as silicon or germanium, if photons enter the depletion layer, ionization occurs. As a result, electron-hole pairs are generated according to the energy of the incident photons. A given bias is applied to the radiation detector. A feedback circuit which has a preamplifier together with an electrostatic capacitor integrates the output signal from the detector. In this way, a voltage is taken which varies in a stepwise fashion according to the amount of radiation. A charge integration-type preamplifier as shown in FIG. 5 is used as the above-described preamplifier. An N-channel FET 22 is used at the first stage of a radiation detector 21. A non-inverting amplifier 23 having a large degree of amplification is connected with the drain terminal D of the FET 22. The output signal from this amplifier 23 is fed back to the gate G of the FET 22 via an electrostatic capacitor $C_f$ having a capacitance of $C_f$.

The polarity of the bias voltage applied to the radiation detector 21 is made positive or negative, depending on the material and on the structure of the detector. The present invention pertains to a preamplifier used in a detector employing a positive bias voltage.

Let E be the energy of photons impinging on the radiation detector 21. The number of electron-hole pairs produced inside the detector 21 is E/W, where W is the energy needed to generate one electron-hole pair. The produced electric charge q (E/W) is driven off by the bias voltage and stored in the electrostatic capacitor $C_f$, it being noted that q is the charge of an electron. The stored charge reduces the output voltage $V_o$ from the non-inverting amplifier 23 by $q(E/W)/C_f$. Therefore, if photons successively enter the radiation detector 21, the output voltage $V_o$ assumes a staircase waveform having a height corresponding to the energy of the photons, as shown in FIG. 6. A signal-processing unit 24 once differentiates this staircase waveform and then integrates it to produce pulses having heights corresponding to the energies. The radiation is counted by a pulse-height analyzer. When no photon enters, the output voltage $V_o$ gradually drops, because the electric charge due to leakage current from the radiation detector is stored in the electrostatic capacitor $C_f$. For this reason, if the output voltage $V_o$ decreases greatly, a saturation takes place. Under this condition, it is impossible to detect radiation. Accordingly, in order to continuously detect and measure radiation, it is necessary to set a threshold voltage $V_r$ before the cutoff voltage $V_c$ is reached. The stored charge is released at this threshold voltage to permit continuous operation.

One conventional preamplifier which continuously releases the electric charge stored in the electrostatic capacitor $C_f$ is shown in FIG. 5(a), where a resistor $R_f$ is connected in parallel with the electrostatic capacitor $C_f$. The addition of the resistor $R_f$ increases resistor noise. Therefore, this network is not suited for a preamplifier used in low-noise applications. Accordingly, a preamplifier as shown in FIG. 5(b) is needed. In particular, when a certain amount of electric charge is stored in the electrostatic capacitor $C_f$, a switch S is closed to electrically discharge the capacitor. This is known as the "reset" function.

This preamplifier has been proposed by V. Radeka, "Charge Amplification Without Charge Leak Resistor," IEEE Trans., Nucl. Sci., NS-17, No. 3, pp. 433-439 (1970). In this preamplifier, as shown in FIG. 7, a given recurrent positive going pulse is superimposed on the DC bias voltage applied to the radiation detector 21 for resetting purposes. The positive pulse voltage is applied to the gate G of an FET 22 via an electrostatic capacitor $C_d$ connected with the radiation detector 21. This increases the output voltage from this FET. If the amplitude of the pulse voltage is made sufficiently large, then the gate G is placed in a positive potential. As a result, the junction between the gate G and the source S of the FET 22 is biased forward and the FET conducts. Hence, the electric charge in the capacitor $C_d$ is released to the source S. Then, if the reset pulse is restored, the charge in the capacitor $C_f$ flows into the capacitor $C_d$. In consequence, the charge stored in the capacitor $C_f$ is also released. In this case, to reduce disturbance in the circuit caused by the addition of pulses of a single polarity, pulses of positive polarity and pulses of negative polarity may both be used.

Another preamplifier used for the same purpose has been proposed by F. S. Goulding et al., "An Improved Operating Mode for A Si(Li) X-Ray Spectrometer," IEEE Trans., Nucl. Sci., NS-37, No. 2, pp. 171-176 (1990). This preamplifier is shown in FIG. 8. On resetting, a negative pulse is applied to the base of a PNP transistor 25 forming a cascode circuit so that the junction between the gate G and the drain D of an FET 22 is forward-biased. In this way, the drain voltage of the FET 22 is urged to drop. The circuit applying the pulse is so designed that the output voltage $V_o$ drops as electric charge is stored in the electrostatic capacitor $C_f$ and that the circuit produces a trigger pulse for resetting the capacitor when a predetermined threshold voltage is reached. In this manner, the base drive circuit is operated.

The former method of superimposing positive going pulses on the DC bias voltage and adding the resulting voltage to the detector 21 has the following two disadvantages. One is that a pulse voltage having a large amplitude is needed because the electrostatic capacitance $C_d$ of the detector 21 is small. Another disadvantage is that noise may enter via the circuit which adds the pulse voltage to the detector 21. These disadvantages are great impediments in putting the preamplifier into practical use.

The latter method requires that a large driving pulse be applied to the base of the PNP transistor as pointed out by the proposer himself. Therefore, the reset response is slow. Hence, this preamplifier is unsuited for measurements at high counting rates.

SUMMARY OF THE INVENTION

It is an object of the present invention to provide a preamplifier capable of electronically discharging a feedback capacitor to reset it.

It is another object of the invention to provide a preamplifier which is used in a radiation detector and which prevents intrusion of noise and offers high resolution and a high counting rate.

The above objects are achieved in accordance with the teachings of the invention by a charge integration-type preamplifier which is used for detection of radiation and has an inverting amplifier having an N-channel FET at its first stage and connected with a radiation detector. The output signal from the inverting amplifier is fed back to the gate of the FET via an electrostatic capacitor. The preamplifier is characterized in that it further includes a reset means which urges the voltage at the output terminal of the inverting amplifier to rise. The potential at the gate is increased by the reset means by utilizing feedback action via the capacitor. The junction between the gate and the source of the FET is forward-biased to release the electric charge stored in the capacitor toward the source, thus resetting the capacitor. This assures continuous operation.

The gate voltage of the FET is urged to rise as proposed by Radeka to forward-bias the junction between the gate and the source. The electric charge stored in the feedback capacitor $D_f$ is released to the source, thus resetting the capacitor. In the novel preamplifier for radiation detection, a positive pulse voltage is not applied via the electrostatic capacitor $C_d$ of the radiation detector. The output voltage $V_o$ is urged to rise by a positive pulse voltage produced in response to a reset trigger signal. The gate voltage is applied via the feedback capacitor $C_f$ so that the voltage acts on the source in the forward direction. In this manner, the charge stored in the feedback capacitor $C_f$ is released to the source. Consequently, any interference causing noise between the radiation detector and the gate of the FET is not created. Furthermore, the disturbance caused by the resetting can be removed in a short time.

Other objects and features of the invention will appear in the course of the description thereof which follows.

DETAILED DESCRIPTION OF THE INVENTION

Figure 1:
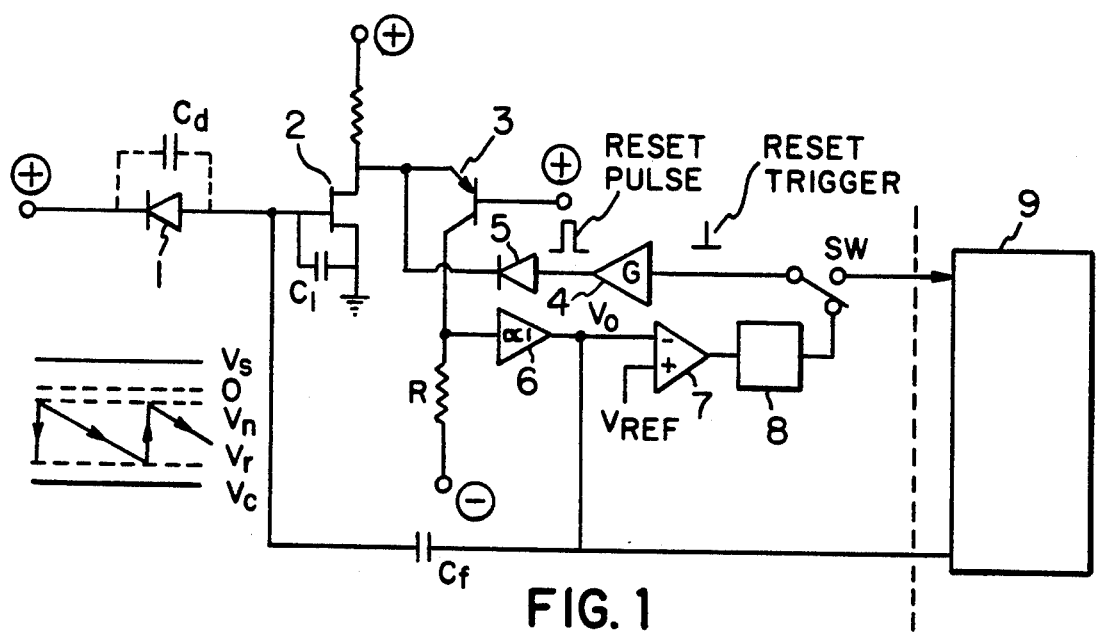
FIG. 1 is a circuit diagram of a preamplifier according to the invention, the preamplifier being used for radiation detection.

Referring to FIG. 1, there is shown a preamplifier which is used for radiation detection and fabricated in accordance with the invention. This figure shows the principle of operation of the preamplifier which includes a cascode circuit consisting of an N-channel FET 2 and a PNP transistor 3 as most frequently encountered in the art. The preamplifier further includes a radiation detector 1, a pulse generator 4, a diode 5, an amplifier 6, a comparator 7, a one-shot multivibrator 8, and a signal-processing unit 9.

The configuration shown in FIG. 1 comprises a charge integration-type preamplifier used for radiation detection and a reset means connected with the preamplifier. This preamplifier includes the cascode circuit consisting of the N-channel FET 2 and the PNP transistor 3, the cascode circuit being connected with the radiation detector 1. The output signal from this cascode circuit is fed back to the gate G of the FET 2 via an electrostatic capacitor $C_f$. The reset means acts to urge the output voltage from the cascode circuit to rise. The reset means includes the pulse generator 4 connected with the emitter of the PNP transistor 3 via the diode 5. The pulse generator 4 produces a reset pulse having a given width and a given amplitude in response to a reset trigger signal. A switch SW acts to switch the source of the reset trigger signal that controls the pulse generator 4 between an internal trigger source and an external trigger source. The internal trigger source consists of the comparator 7 and the one-shot multivibrator 8. The external trigger source consists of the signal-processing unit 9 connected with the output of the preamplifier. The comparator 7 compares the output voltage $V_o$ with a threshold voltage $V_r$. When the output voltage $V_o$ reaches a given value, the comparator 7 activates the one-shot multivibrator 8 to cause it to produce the reset trigger signal to the pulse generator 4. For example, the signal-processing unit 9 accepts the output voltage $V_o$ from the preamplifier, counts the radiation, makes a decision to see that the output voltage $V_o$ has substantially reached the threshold voltage $V_r$, and supplies the reset trigger signal to the pulse generator 4. It is also possible to supply a reset trigger signal to the pulse generator 4 at regular intervals of time.

The various constants of the circuit of FIG. 1 are so determined that the output voltage $V_o$ appearing at the collector of the PNP transistor 3 assumes a saturation voltage $V_s$ close to zero potential when the voltage at the gate G of the FET 2 is a certain negative value, and that the output voltage $V_o$ assumes a negative cutoff voltage $V_c$ when the voltage at the gate G takes a certain value close to zero. The preamplifier must be operated within this range of voltages.

The operation is next described. As already described, when a positive bias voltage is applied to the radiation detector 1, electric charge generated by ionization of the incident photons increases the gate voltage. If this potential approaches zero, the output voltage $V_o$ will become the cutoff voltage $V_c$. Therefore, the comparator (or a discriminator) 7 makes a decision to see that the output voltage $V_o$ has reached the predetermined negative reference voltage $V_r$. The output signal from the comparator 7 activates the one-shot multivibrator 8, so that it produces a reset trigger signal. When the switch SW is in the illustrated condition, this trigger signal is fed to the pulse generator 4 and, therefore, pulses can be generated. Hence, the output voltage $V_o$ can be urged to rise. This voltage makes the voltage at the gate G of the FET 2 assume some positive value via the feedback capacitor $C_f$. Electric charge stored in the capacitor $C_f$ is released through the path from the gate G to the source S. Thus, the resetting operation is completed. When the switch SW is switched to the signal-processing unit 9, the preamplifier operates similarly. Also, when the trigger signal is supplied from the signal-processing unit 9 to the pulse generator 4, the preamplifier functions similarly. Furthermore, when a trigger signal is periodically supplied to the pulse generator 4, the preamplifier operates similarly.

Figure 2:
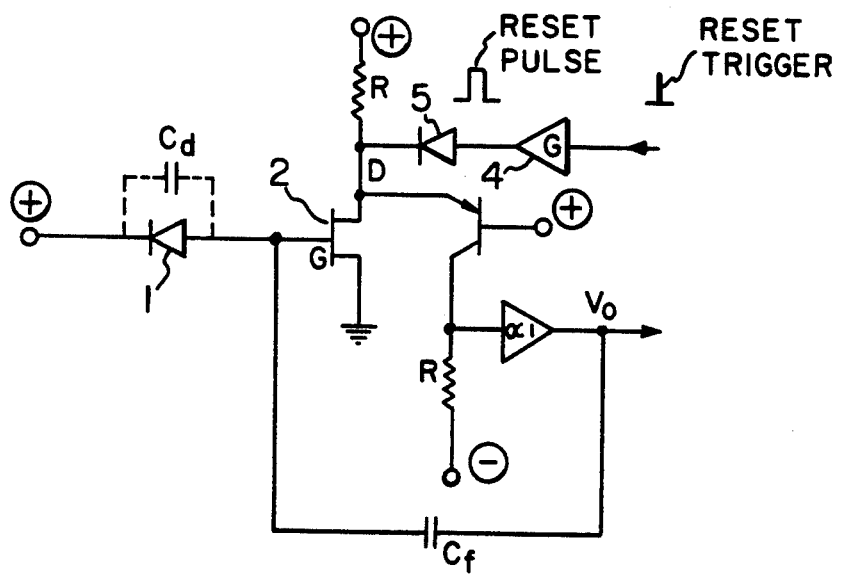
FIG. 2 is a circuit diagram of another preamplifier according to the invention, the preamplifier being used for radiation detection.
Figure 3:
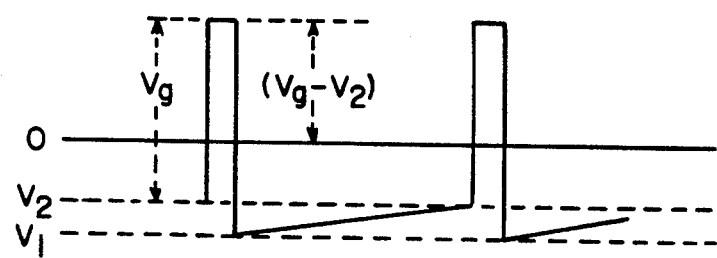
FIG. 3 is a diagram illustrating variations in the potential of the gate of the FET included in the preamplifier shown in FIG. 2.

Referring to FIG. 2, there is shown another preamplifier according to the invention used for radiation detection. This figure illustrates the principle of operation for efficiently achieving the inventive operation described above. FIG. 3 illustrates variations in the gate potential.

In the preamplifier shown in FIG. 2, a pulse generator 4 is connected with the drain terminal D of an FET 2 via a diode 5 so that a reset pulse having a pulse height of $I_d$ flows into the drain terminal. This current increases the output voltage $V_o$ by $I_d R$. The resistance R is set to a large value in the preamplifier. Therefore, a large degree of amplication of voltage due to the large resistance can be utilized. This makes it possible to reduce the control current $I_d$ flowing into the drain D of the FET 2.

More specifically, an increase in the output voltage $V_o$ produces an increase in the voltage at the gate G of the FET 2. The produced increase is given by $$V_g = I_d R (C_d + C_i)/(C_d + C_i + C_f)$$

Figure 6:
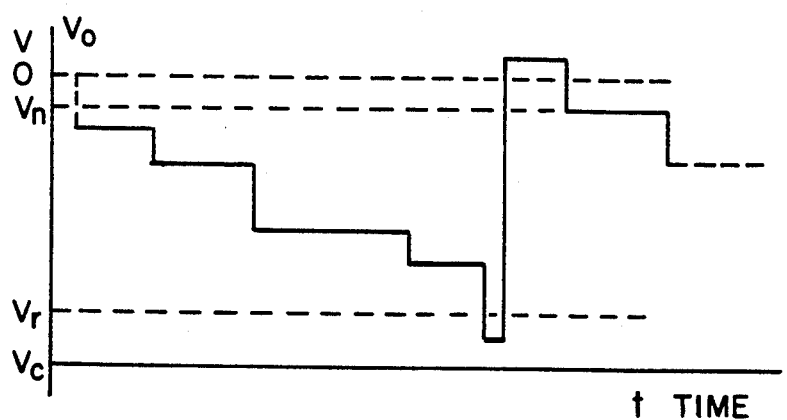
FIG. 6 is a waveform diagram of the output voltages from the conventional preamplifiers shown in FIG. 5(a) and FIG. 5(b).
Figure 7:
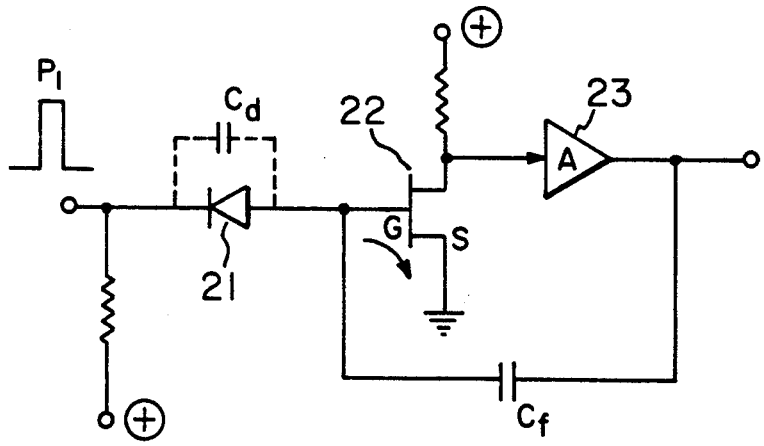
FIG. 7 is a circuit diagram of a further conventional preamplifier in which a reset pulse is superimposed on a DC bias to a radiation detector.
Figure 8:
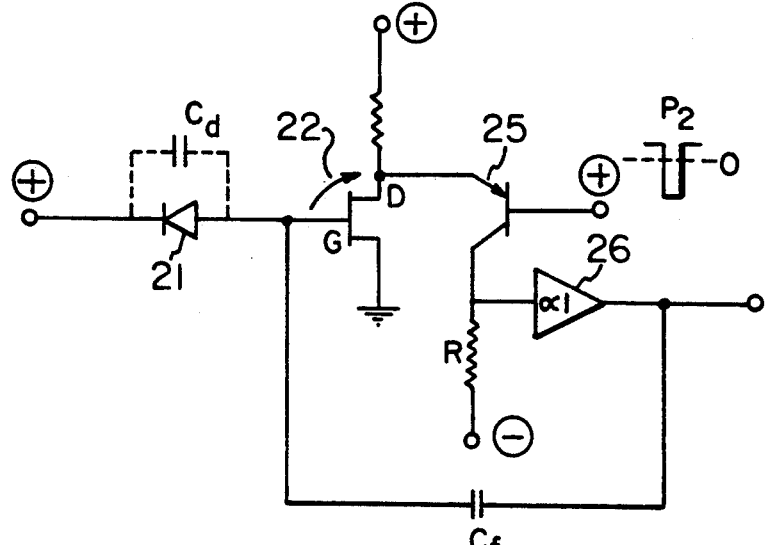
FIG. 8 is a circuit diagram of still another conventional preamplifier which is used for radiation detection and in which a reset pulse is applied to the base of a PNP transistor.

During normal operation, the potential at the gate G swings between a negative value $V_1$ and another negative value $V_2$ as shown in FIG. 3. In particular, as a positive voltage is applied to the radiation detector 1, and an electric charge caused by ionization due to photons flows into the gate, the gate voltage increases from $V_1$ to $V_2$. As shown in FIG. 6, as the gate voltage increases, the output voltage $V_o$ drops from $V_n$ corresponding to the gate voltage $V_1$ toward $V_c$. $V_2$ is a gate voltage at which the output voltage $V_o$ has just reached the threshold voltage $V_r$. Therefore, in the same way as in the embodiment shown in FIG. 1, a discriminator or the like (not shown) makes a decision to see that the output voltage $V_o$ has reached the threshold voltage $V_r$ and produces a reset signal. If the amplitude $V_g$ of the reset pulse is sufficiently large, then the gate voltage assumes a positive value of $(V_g - V_2)$, as shown in FIG. 3. At this time, if the width of the reset pulse is sufficiently large compared with the discharging time constant of the gate/source circuit of the FET 2, then the electric charge flowing into the source is $C_f(V_g - V_2)$. This discharging releases the electric charge stored in the capacitor $C_f$. In this way, the resetting operation is completed. The reset pulse ceases. The gate voltage of the FET 2 returns to $V_1$.

Figure 4:
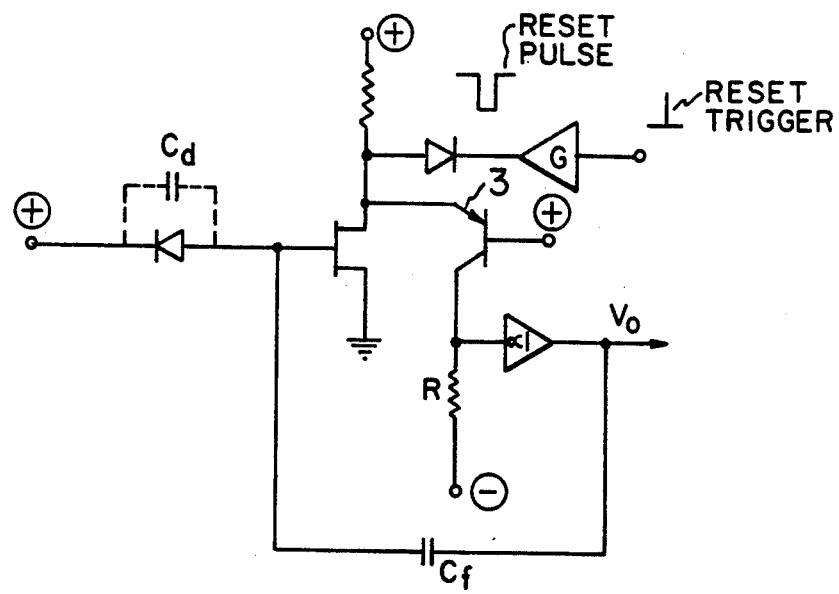
FIG. 4 is a circuit diagram of a further preamplifier according to the invention, the preamplifier being used for radiation detection.
Figure 5A:
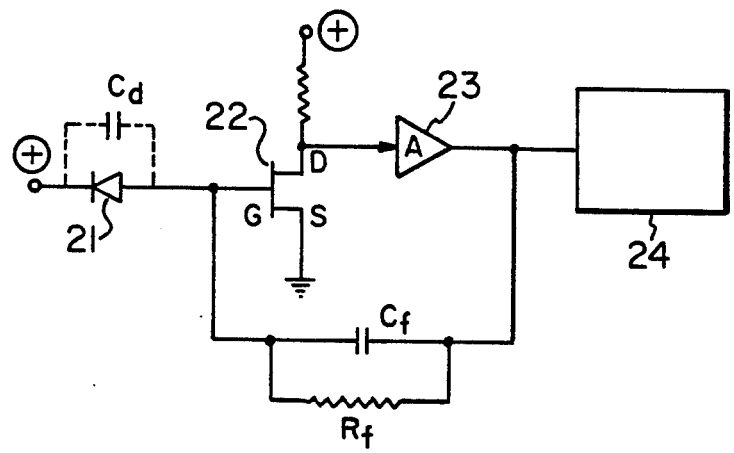
FIG. 5(a) and FIG. 5(b) are circuit diagrams of conventional preamplifiers used for radiation detection.
Figure 5B:
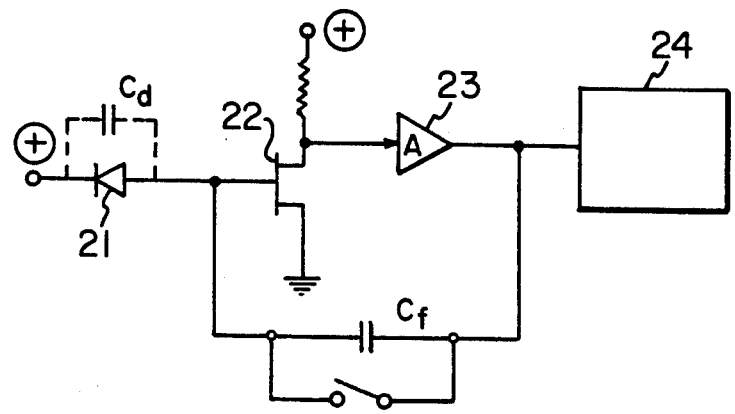

FIG. 4 shows the principle of operation of a further preamplifier according to the invention, the preamplifier being used for radiation detection. This preamplifier is similar to the preamplifier shown in FIG. 2 except that the polarity of the reset pulse applied to the emitter of the PNP transistor 3 is negative rather than positive. In the configuration of FIG. 4, when the amplitude of a negative current produced by the reset pulse exceeds a certain value, the current flowing into the emitter of the PNP transistor 3 is cut off. If the amplitude of the negative current produced by the reset pulse increases, the reverse bias voltage applied to the emitter junction exceeds the allowable voltage for the emitter. As a result, avalanche breakdown occurs in the PNP transistor 3, producing free carriers in the base region. Therefore, even after the end of the reset pulse, the PNP transistor 3 continues to conduct. Because of the inflow of current from the power supply, the output voltage $V_o$ increases rapidly. This output voltage $V_o$ is controlled by the amount of free carriers generated in the base region, hence by the amplitude of the reset pulse. The voltage at the gate is increased by the output voltage $V_o$, in the same way as in the embodiment shown in FIG. 2.

It is to be understood that the present invention is not limited to the above embodiments and that various modifications and changes are possible. In the above embodiments, to produce the reset trigger signal, the comparator or discriminator compares the level of the output voltage $V_o$ with the level of the threshold voltage $V_r$. Alternatively, the signal-processing unit produces the reset trigger signal according to the detected amount of radiation. Pulses produced from a separate pulse generator may also be used.

As can be understood from the description made thus far, the present invention provides the reset means which urges the voltage at the output terminal to rise. Hence, any interference causing noise is not created between the radiation detector and the gate of the FET. In addition, disturbance caused by the resetting can be quickly removed. Consequently, the present invention can be quite effectively applied to a preamplifier used in a radiation detection spectrometer having high resolution and realizing high counting rate.

Having thus described our invention with the detail and particularity required by the Patent Laws, what is desired and claimed to be protected by Letters Patent is set forth in the following claims.

What is claimed is:

1. A charge integration preamplifier comprising:
    an inverting amplifier including an N-channel field effect transistor connected with a radiation detector, an output signal from said inverting amplifier being fed back to a gate of said field effect transistor via an electrostatic capacitor;
    a PNP transistor connected to a drain terminal of said N-channel field effect transistor to form a cascode circuit; and 'a reset means attached to an emitter terminal of said PNP transistor, wherein said reset means injects positive pulse current into said emitter terminal of said PNP transistor.

2. The charge integration preamplifier of claim 1, wherein said reset means injects negative pulse current into an emitter current of said PNP transistor.

3. The charge integration preamplifier as claimed in claim 1, in which said reset means includes a pulse generator connected to said emitter terminal of said PNP transistor via a diode.

4. The charge integration preamplifier as claimed in claim 3, further including a switch which switches a source of a reset trigger signal to said pulse generator between an internal trigger source and an external source.

5. The charge integration preamplifier as claimed in claim 4, wherein said internal trigger source includes a comparator connected to a one-shot multivibrator, wherein said comparator compares a circuit output voltage with a predetermined threshold voltage so that when said output voltage reaches said predetermined threshold voltage, said comparator activates said multivibrator to cause said multivibrator to transmit said reset trigger signal to said pulse generator.

6. The charge integration preamplifier as claimed in claim 4, wherein said external trigger source includes a signal-processing unit connected to an output of said preamplifier; and wherein said signal-processing unit compares a circuit output voltage with a predetermined threshold voltage so that when said output voltage reaches said predetermined threshold voltage, said signal-processing unit transmits said reset trigger signal to said pulse generator.

* * * * *

UNITED STATES PATENT AND TRADEMARK OFFICE
CERTIFICATE OF CORRECTION

PATENT NO. : 5,322,995
DATED : June 21, 1994
INVENTOR(S) : Shoichi Ohkawa and Kazuo Hushimi It is certified that error appears in the above-indentified patent and that said Letters Patent is hereby corrected as shown below:

Column 2 Line 50 "$C_f$ and" should read --$C_f$ and--.

Column 3 Line 32 "$D_f$ is" should read --$D_f$ is--.

Column 3 Line 39 "$C_f$ so" should read --$C_f$ so--.

Claim 1 Line 58 Column 6 " 'a " should read --a-- and that should begin a new paragraph.

Claim 4 Line 4 Column 7 after "external" insert --trigger--.

Signed and Sealed this

Thirtieth Day of August, 1994

Attest:

Attesting Officer

BRUCE LEHMAN

Commissioner of Patents and Trademarks